United States Patent
Kato et al.

(10) Patent No.: US 11,129,282 B2
(45) Date of Patent: Sep. 21, 2021

(54) METHOD FOR MANUFACTURING CERAMIC CIRCUIT BOARD

(71) Applicants: KABUSHIKI KAISHA TOSHIBA, Tokyo (JP); TOSHIBA MATERIALS CO., LTD., Yokohama (JP)

(72) Inventors: Hiromasa Kato, Nagareyama Chiba (JP); Hideaki Hirabayashi, Yokohama Kanagawa (JP); Fumiyuki Kawashima, Matsudo Chiba (JP); Akito Sasaki, Yokohama Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 16/774,820

(22) Filed: Jan. 28, 2020

(65) Prior Publication Data
US 2020/0170118 A1    May 28, 2020

Related U.S. Application Data

(63) Continuation of application No. PCT/JP2018/033207, filed on Sep. 7, 2018.

(30) Foreign Application Priority Data

Sep. 12, 2017  (JP) .............................. JP2017-174787
Jan. 25, 2018  (JP) .............................. JP2018-010679

(51) Int. Cl.
*H05K 3/26* (2006.01)
*H05K 3/06* (2006.01)
(Continued)

(52) U.S. Cl.
CPC ........... *H05K 3/067* (2013.01); *C04B 37/023* (2013.01); *C09K 13/00* (2013.01); *C09K 13/04* (2013.01);
(Continued)

(58) Field of Classification Search
CPC ........ C04B 2235/6581; C04B 2235/96; C04B 2235/9607; C04B 2237/125;
(Continued)

(56) References Cited

U.S. PATENT DOCUMENTS 6,413,589 B1 * 7/2002 Li ........................... C22C 47/08
427/376.6
6,918,529 B2 * 7/2005 Tsukaguchi .............. H05K 3/06
216/41
(Continued)

FOREIGN PATENT DOCUMENTS

JP      2594475 B2    3/1997
JP   H10-154866 A    6/1998
(Continued)

*Primary Examiner* — Lan Vinh
(74) *Attorney, Agent, or Firm* — Harness, Dickey & Pierce, P.L.C.

(57) ABSTRACT

According to one embodiment, a method for manufacturing a ceramic circuit board is disclosed. The ceramic circuit board includes a copper plate bonded to at least one surface of a ceramic substrate via a brazing material layer including Ag, Cu, and a reactive metal. The method includes: preparing a ceramic circuit board in which a copper plate is bonded on a ceramic substrate via a brazing material layer, and a portion of the brazing material layer is exposed between a pattern shape of the copper plate; a first chemical polishing process of chemically polishing the portion of the brazing material layer; and a first brazing material etching process of etching the chemically polished portion of the brazing material layer by using an etchant having a pH of 6 or less and including one type or two types selected from hydrogen peroxide and ammonium peroxodisulfate.

20 Claims, 3 Drawing Sheets

(51) Int. Cl.
*C04B 37/02* (2006.01)
*C09K 13/00* (2006.01)
*C09K 13/04* (2006.01)
*C23F 1/02* (2006.01)
*C23F 1/16* (2006.01)

(52) U.S. Cl.
CPC .................. *C23F 1/02* (2013.01); *C23F 1/16* (2013.01); *H05K 3/26* (2013.01); *C04B 2237/125* (2013.01); *C04B 2237/368* (2013.01); *C04B 2237/407* (2013.01); *C04B 2237/60* (2013.01); *C04B 2237/86* (2013.01); *H05K 2203/0285* (2013.01); *H05K 2203/0776* (2013.01); *H05K 2203/0789* (2013.01)

(58) Field of Classification Search
CPC ........ C04B 2237/126; C04B 2237/127; C04B 2237/343; C04B 2237/366; C04B 2237/368; C04B 2237/402; C04B 2237/407; C04B 2237/704; C04B 41/88; C09K 13/00; C09K 13/04; C09K 13/08; C10G 1/10; C10G 2300/201; C10G 45/04; C10G 45/06; C10G 45/08; C10G 45/10; C10G 67/10; H05K 3/06; H05K 3/067; H05K 3/20; H05K 3/26; H05K 1/0306; H05K 1/09; H05K 2203/0285; H05K 2203/0776; H05K 2203/0789; H05K 3/38; C23F 1/02; C23F 1/16; C23F 1/18; C23F 1/30; C23F 3/06; C23F 1/44; H01L 21/4846; H01L 23/15; H01L 23/3735
USPC ....... 216/13, 78, 79; 438/455, 459, 692, 693
See application file for complete search history.

(56) References Cited

U.S. PATENT DOCUMENTS

| | | | | |
|---|---|---|---|---|
| 2001/0006841 | A1* | 7/2001 | Tsuchiya | H01L 21/7684 438/584 |
| 2001/0009066 | A1* | 7/2001 | Bhatt | H05K 3/4069 29/846 |
| 2003/0066865 | A1* | 4/2003 | Tsukaguchi | H05K 3/38 228/122.1 |
| 2004/0069528 | A1 | 4/2004 | Sakuraba et al. | |
| 2004/0262367 | A1 | 12/2004 | Nakamura | |
| 2010/0301010 | A1* | 12/2010 | Lin | C23F 1/26 216/41 |
| 2013/0256014 | A1* | 10/2013 | Takahashi | H05K 1/092 174/257 |
| 2015/0072477 | A1* | 3/2015 | Matsumura | H01L 24/83 438/118 |
| 2016/0122590 | A1* | 5/2016 | Lew | C23F 3/04 438/693 |
| 2016/0192503 | A1 | 6/2016 | Chiwata | |
| 2017/0355882 | A1* | 12/2017 | Otsuki | C09K 3/1409 |
| 2018/0005918 | A1 | 1/2018 | Naba et al. | |

FOREIGN PATENT DOCUMENTS

| | | |
|---|---|---|
| JP | 2003-060111 A | 2/2003 |
| JP | 2005-035874 A | 2/2005 |
| JP | 2008-147446 A | 6/2008 |
| JP | 2011-211217 A | 10/2011 |
| JP | 4811756 B2 | 11/2011 |
| JP | 2013-084822 A | 5/2013 |
| JP | 2013-173666 A | 9/2013 |
| WO | WO-2015/029478 A1 | 3/2015 |
| WO | WO-2017/056360 A1 | 4/2017 |

* cited by examiner

METHOD FOR MANUFACTURING CERAMIC CIRCUIT BOARD

CROSS-REFERENCE TO RELATED APPLICATIONS

This is a continuation application of International Application PCT/JP2018/033207, filed on Sep. 7, 2018. This application also claims the benefit of priority from Japanese Patent Application No. 2017-174787, filed on Sep. 12, 2017 and Japanese Patent Application No. 2018-010679, filed on Jan. 25, 2018. The entire contents of each are incorporated herein by reference.

FIELD

An embodiment relates to a method for manufacturing a ceramic circuit board.

BACKGROUND

The outputs of power modules are being increased. Accordingly, guaranteed operating temperatures of semiconductor elements have become high and are 175° C. or more. Therefore, it is desirable also to improve the TCT (thermal cycle test) characteristics of ceramic circuit boards on which the semiconductor elements are mounted.

For example, the provision of an oblique structure in a copper plate side surface and the optimization of the jutting portion size of a bonding layer are recited in International Publication No. 2017/056360 (Patent Literature 1). Excellent TCT characteristics are obtained in Patent Literature 1. It is particularly favorable to optimize the jutting portion size of the bonding layer.

Etching of a brazing material layer is performed to control the jutting portion size of the bonding layer. A reactive metal brazing material is used to bond the ceramic substrate and the copper plate. The reactive metal brazing material is a brazing material including Ag (silver), Cu (copper), and Ti (titanium). Also, Sn (tin) and In (indium) are included as necessary. The reactive metal brazing material includes components other than Cu. Therefore, the brazing material layer remains after the process of etching the copper plate itself into a prescribed pattern shape. Therefore, a brazing material etching process that removes the unnecessary brazing material layer is necessary.

For example, a brazing material etchant in which a chelating agent, hydrogen peroxide, and a pH-adjusting agent are mixed is used in Japanese Patent No. 4811756 (Patent Literature 2). In Patent Literature 2, Ethyleneiaminetetraacetic acid (EDTA) or the like is used as the chelating agent. Also, aqueous ammonia is used as the pH-adjusting agent. In Patent Literature 2, the brazing material jutting portion size is controlled by such brazing material etching.

However, in the method of Patent Literature 2, a long period of time of 150 minutes is necessary for one brazing material etching process. Therefore, the suitability for mass production is poor.

DETAILED DESCRIPTION

A method for manufacturing a ceramic circuit board according to an embodiment is a method for manufacturing a ceramic circuit board in which the ceramic circuit board includes a copper member bonded to at least one surface of a ceramic substrate via a brazing material layer including Ag, Cu, and a reactive metal, and the method includes: preparing a ceramic circuit board in which a copper plate is bonded on a ceramic substrate via a brazing material layer, and a portion of the brazing material layer is exposed between a pattern shape of the copper plate; a first chemical polishing process of chemically polishing the portion of the brazing material layer; and a first brazing material etching process of etching the chemically polished portion of the brazing material layer by using an etchant having a pH of 6 or less and including one type or two types selected from hydrogen peroxide and ammonium peroxodisulfate.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

The ceramic circuit board includes the ceramic substrate and the copper member bonded via the brazing material layer including Ag, Cu, and a reactive metal. A so-called reactive metal technique is used.

A silicon nitride substrate, an aluminum nitride substrate, an aluminum oxide substrate, an Alusil substrate, etc., are examples of the ceramic substrate. For example, the plate thickness of the ceramic substrate is 0.2 to 0.8 mm. For example, the thermal conductivity of the silicon nitride substrate is 80 W/m·K or more; and the three-point bending strength of the silicon nitride substrate is 600 MPa or more. For example, the thermal conductivity of the aluminum nitride substrate is 150 W/m·K or more; and the three-point bending strength of the aluminum nitride substrate is 300 to 550 MPa. For example, the thermal conductivity of the aluminum oxide substrate is 20 to 40 W/m·K; and the three-point bending strength of the aluminum oxide substrate is 400 to 500 MPa.

Also, the Alusil substrate is an aluminum oxide substrate including zirconium oxide. The thermal conductivity of the Alusil substrate is 20 to 40 W/m·K; and the three-point bending strength of the Alusil substrate is 450 to 600 MPa. Because the strength of the silicon nitride substrate is high, it is possible to thin the substrate to be 0.33 mm or less. The aluminum nitride substrate has a high thermal conductivity. Also, although the thermal conductivities of the aluminum oxide substrate and the Alusil substrate are low, these substrates are inexpensive. The type of the ceramic substrate can be selected as appropriate to match the purpose. Also, the silicon nitride substrate and the aluminum nitride substrate are called nitride ceramics. The aluminum oxide substrate and the Alusil substrate are called oxide ceramics.

It is favorable for the copper member to be made of oxygen-free copper. When the oxygen inside the copper member is high, there is a possibility that the bonding strength may decrease in the reactive metal bonding. The copper member may be a copper plate or may be a film of copper formed on the brazing material layer. Hereinafter, the case will be described where the copper member is a copper plate.

It is favorable for the plate thickness of the copper plate to be 0.2 mm or more. Also, the heat dissipation of the copper plate can be improved by increasing the thickness to be 0.7 mm or more. Although the upper limit of the plate thickness is not particularly limited, it is favorable for the plate thickness of the copper plate to be 5 mm or less. When the plate thickness exceeds 5 mm, the warp of the ceramic circuit board becomes large when bonding the copper plate and the ceramic substrate. Also, the patterning into the pattern shape by etching becomes difficult.

The reactive metal brazing material includes Ag, Cu, and a reactive metal as essential components. The combination of Ag and Cu is eutectic. By forming the AgCu eutectic, the bonding strength between the ceramic substrate and the copper plate can be increased. Also, the reactive metal is one, two, or more types selected from Ti (titanium), Zr (zirconium), Hf (hafnium), and Nb (niobium). Among the reactive metals, Ti is favorable. The reactive metal can form a strong bond by reacting with the ceramic substrate. A reactive metal nitride phase is formed with the nitride ceramic. For example, a titanium nitride (TiN) phase is formed in the case where the reactive metal includes Ti. Also, a reactive metal oxide phase is formed with the oxide ceramic. For example, a titanium oxide ($TiO_2$) phase is formed in the case where the reactive metal includes Ti. Also, the reactive metal may be a simple metal or may be added as a hydride.

Also, Sn (tin) or In (indium) may be added to the reactive metal brazing material as necessary. Sn and In can lower the melting point of the reactive metal brazing material. Therefore, the bonding temperature can be lowered. Bonding at a low temperature can reduce the residual stress of the bonded bodies. The decrease of the residual stress is effective to increase the thermal cycle reliability of the bonded bodies.

Also, C (carbon) may be added to the reactive metal brazing material as necessary. The fluidic property of the brazing material can be suppressed by adding carbon. Therefore, the thickness of the brazing material layer can be more uniform.

Also, in the reactive metal brazing material, it is favorable for the content of Ag to be not less than 40 wt % and not more than 80 wt %, the content of Cu to be not less than 15 wt % and not more than 45 wt %, the content of the reactive metal to be not less than 1 wt % and not more than 12 wt %, the content of Sn (or In) to be not less than 0 wt % and not more than 20 wt %, and the content of C to be not less than 0 wt % and not more than 2 wt %. The total content of Ag, Cu, Ti, Sn (or the In), and C is taken as 100 wt %. Also, when Sn or In is added to the reactive metal brazing material, it is favorable for the content of Sn or In to be 5 wt % or more. In the case where both Sn and In are added, it is favorable for the total content to be within the range of 5 to 20 wt %. Also, when carbon is added to the reactive metal brazing material, it is favorable for the content of carbon to be 0.1 wt % or more.

The bonding process includes mainly a coating process and a heating process.

In the coating process, first, the bonding brazing material paste recited above is prepared. The bonding brazing material paste is coated onto the ceramic substrate; and the copper plate is placed on the bonding brazing material paste. It is favorable for the coating thickness of the bonding brazing material paste to be in the range of 10 to 60 μm. For a coating thickness of less than 10 μm, there is a risk that the bonding strength may decrease due to insufficient bonding brazing material. Also, when the coating thickness exceeds 60 μm, improvement of the bonding strength is not observed; and this also causes a cost increase. In the case where the copper plate is bonded to two surfaces, the bonding brazing material paste is coated onto the two surfaces of the ceramic substrate. Also, it is favorable to place a copper plate having about the same size as the region where the brazing material paste is coated. Also, a copper plate that already has a pattern shape may be placed.

Then, a heating process is performed. The heating temperature is within the range of 700 to 900° C. Also, it is favorable for the heating process to be performed in a non-oxidative atmosphere in an atmosphere of $1\times10^{-3}$ Pa or less. The bonding temperature can be set to 850° C. or less by adding Sn or In to the brazing material.

The ceramic substrate and the copper plate can be bonded by such processes.

First, a ceramic circuit board is prepared in which a copper plate is bonded via a brazing material layer, and a portion of the brazing material layer is exposed between the pattern shape of the copper plate. For example, the ceramic circuit board recited above is prepared by patterning the copper plate bonded on the ceramic substrate into a pattern shape by etching a portion of the copper plate. The ceramic circuit board recited above may be prepared by bonding the multiple copper plates patterned into the pattern shape or on the ceramic substrate. Or, the ceramic circuit board may be prepared by introducing a ceramic circuit board in which the prescribed pattern shape is provided beforehand in the copper plate.

To cause a location to exist where the brazing material layer is exposed, a method that has an etching process of the copper plate is effective. A method of bonding a copper plate that is pre-patterned into a pattern shape also is effective. On the other hand, considering the misalignment of the copper plate in the bonding process, it may be difficult to accommodate a complex pattern shape and/or a fine pitch (narrow spacing between adjacent copper plates). Therefore, it is favorable to form the copper plate into the pattern shape by etching. A fine pitch refers to the spacing between the adjacent copper plates being 2 mm or less.

In the process of etching the copper plate, an etching resist is coated at the location to remain as the copper plate pattern. Iron chloride mainly is used in the copper plate etching process. Iron chloride is effective for etching copper. On the other hand, a brazing material layer that includes Ag, Cu, and a reactive metal cannot be etched by iron chloride. Therefore, a location can exist where the brazing material layer is exposed. Also, a cleaning process may be performed after the copper plate etching process as necessary. Instead of iron chloride, copper chloride may be used to etch the copper plate.

Then, a chemical polishing process of chemically polishing the etched brazing material layer location is performed. In the chemical polishing process, it is favorable to use a chemical polishing liquid including sulfuric acid or hydrochloric acid. Although the chemical polishing liquid may include both sulfuric acid and hydrochloric acid, it is favorable to include only one of sulfuric acid or hydrochloric acid. There is a possibility that the exposed brazing material layer may oxidize. Also, there is a possibility that reactants may form due to reactions with the etchant etching the copper plate. Also, as described below, a portion of the components of the exposed brazing material layer becomes an oxide due to the brazing material etching process. Such oxides can be removed by the chemical polishing process. It is favorable for the chemical polishing liquid to be a sulfuric acid aqueous solution, a hydrochloric acid aqueous solution, or an aqueous solution in which sulfuric acid and hydrogen peroxide are mixed. Also, the sulfuric acid aqueous solution also includes an aqueous solution including a sulfate such as sodium thiosulfate ($Na_2S_2O_3$), etc.

It is favorable for the sulfuric acid to satisfy the quality of JIS-K-8951 (2006). Also, it is favorable for the hydrochloric acid to satisfy the quality of JIS-K-8180 (2015). JIS-K-8951 and JIS-K-8180 correspond to ISO 6352-2. Also, it is favorable for the sodium thiosulfate to satisfy the quality of JIS-K-8638 (2011). ISO 6352-2 is referred to in WS-K-8638.

It is favorable for the sulfuric acid concentration of the sulfuric acid aqueous solution to be within the range of 0.5 to 25 wt %. Also, it is favorable for the hydrochloric acid concentration of the hydrochloric acid aqueous solution to be within the range of 0.5 to 20 wt %. Also, if the concentration of either is less than 0.5 wt %, it is favorable for the total of sulfuric acid and hydrogen peroxide in the aqueous solution in which sulfuric acid and hydrogen peroxide are mixed to be within the range of 0.5 to 30 wt %. There is a possibility that the effect of the chemical polishing may be insufficient. Also, when high, there is a possibility that the chemical polishing effect may become too high if 20 wt % is exceeded. The size adjustment of the brazing material jutting portion becomes difficult when the chemical polishing effect becomes too high. Therefore, it is favorable for the concentrations of sulfuric acid, hydrochloric acid, and hydrogen peroxide to be within the range of 0.5 to 20 wt %, and more favorably 1 to 10 wt %. Also, in the case where a sodium thiosulfate aqueous solution is used as the sulfuric acid aqueous solution, it is favorable for 0.01 to 1 wt % of a chelating agent to be added. The pH can be lowered by adding the chelating agent.

It is favorable for the chemical polishing process using the sodium thiosulfate aqueous solution as the chemical polishing liquid to be performed as pre-processing before performing the brazing material etching process. Before performing the brazing material etching process refers to a process of chemically polishing the exposed brazing material layer after the copper plate etching. A copper plate etchant that includes iron chloride or copper chloride is used in the copper plate etching process. The reactive metal brazing material layer includes Ag (silver). AgCl (silver chloride) forms easily due to a reaction of the Ag inside the brazing material layer and the Cl of the copper plate etchant. The sodium thiosulfate aqueous solution has a high effect of decomposing AgCl. By pre-decomposing the AgCl by using the sodium thiosulfate aqueous solution, the brazing material etching process can be performed in a short period of time. When the thickness of the copper plate is 0.7 mm or more, the time of the exposure to the copper plate etchant lengthens. Therefore, AgCl forms easily at the exposed brazing material layer surface.

In the case where the chemical polishing process is performed multiple times, it is favorable to use the sodium thiosulfate aqueous solution in the chemical polishing process of the first time. In the chemical polishing processes of the second and subsequent times, a chemical polishing liquid that includes hydrochloric acid or sulfuric acid (not including sodium thiosulfate) may be used.

It is favorable for one chemical polishing process to be 5 minutes or less. When long, i.e., exceeding 5 minutes, there is a possibility that the copper plate surface undesirably may be rough. When 5 minutes or less, the surface roughness Ra of the copper plate is 2 µm or less. Also, if the chemical polishing process time is set to not less than 20 seconds and not more than 2 minutes, a flat surface can be maintained in which the surface roughness Ra of the copper plate is 1 µm or less. Therefore, even if the brazing material etching process is performed after the etching resist coated onto the copper plate surface is peeled in the copper plate etching process, a flat surface is possible in which the copper plate surface roughness Ra is 0.1 to 1 µm. It is unnecessary to consider discrepancies occurring due to reactions of the etching resist with the brazing material etchant or the chemical polishing liquid.

Two or more types of chemical polishing liquids may be used in one chemical polishing process. In other words, after performing chemical polishing using a chemical polishing liquid including some component in one chemical polishing process, chemical polishing that uses a chemical polishing liquid including another component may be performed. Also, in the case where the chemical polishing process is performed two or more times, the chemical polishing liquid and/or the conditions (the time, etc.) may be changed each process.

It is favorable for the brazing material etching process to be performed after the chemical polishing process. In the case where the brazing material layer that could not be removed exists after the chemical polishing process, it is effective to perform a brazing material etching process again. Also, it is favorable to perform a cleaning process after the brazing material etching process and after the chemical polishing process. By introducing the cleaning process, the brazing material etchant or the chemical polishing liquid can be prevented from remaining and having an unfavorable effect on the next process.

In the etching process of the brazing material layer after the chemical polishing process, the brazing material layer is etched using an etchant having a pH of 6 or less and including one type or two types selected from hydrogen peroxide or ammonium peroxodisulfate.

The rate of etching the brazing material layer is slower when the pH of the brazing material etchant is large and exceeds 6. Also, it is favorable for the pH of the brazing material etchant etching the brazing material layer to be 4 or more. Also, when the pH is less than 4, there is a possibility that the rate of etching the brazing material layer may be too fast. To improve the TCT characteristics of the ceramic circuit board, it is effective to cause the brazing material jutting portion (the bonding layer jutting portion) to remain. When the etching rate of the brazing material layer is too fast, the size control of the brazing material jutting portion is difficult. Therefore, for the etchant having the pH of 6 or less, it is more favorable for the pH to be not less than 4.0 and not more than 5.8.

Also, it is favorable for the etchant having the pH of 6 or less to include hydrogen peroxide, ammonium fluoride, and a pH-stabilizing agent.

Hydrogen peroxide ($H_2O_2$) or ammonium peroxodisulfate (($NH_4)_2S_2O_8$) has the effect of removing Ag and Cu. Ag and Cu can be removed by ionization. In particular, the effect of the ionization is increased by setting the pH to be 6 or less. Also, the hydrogen peroxide or the ammonium peroxodisulfate also have the effect of an oxidizing agent that oxidizes a reactive metal, Sn, In, and carbon. For example, in the case where the brazing material includes Ti, TiN (titanium nitride) is on the nitride ceramic substrate. The etching components described above have the effect of changing Ti or TiN into $TiO_2$. Similarly, there is an effect of changing the Sn inside the brazing material into $SnO_2$. This is similar also for In, etc.

It is favorable for the hydrogen peroxide to have the quality of JIS-K-1463 (2007). ISO 6352-2 is referred to in WS-K-1463. Also, it is favorable for the ammonium peroxodisulfate to have the quality of JIS-K-8252 (2010).

Ammonium fluoride ($NH_4F$) functions as an etchant of oxides. For example, $TiO_2$ can be changed into $TiOF_2$ and removed. Also, ammonium hydrogen fluoride (($NH_4$)$HF_2$) also is included in the ammonium fluoride.

The pH-stabilizing agent can stabilize the pH of a mixed solution of ammonium fluoride and one type or two types selected from hydrogen peroxide and ammonium peroxodisulfate. It is favorable for the pH-stabilizing agent to be one, two, or more types selected from $HBF_4$, EDTA, NTA, CyDTA, DTPA, TTHA, GEDTA, glycine, dicarboxylic acid, tricarboxylic acid, oxycarboxylic acid, and salts of these substances. The pH can be adjusted to be within the range of 4 to 6 by these pH-stabilizing agents.

It is favorable for the pH-stabilizing agent to be $HBF_4$. The pH can be adjusted to be not less than 4.0 and not more than 5.8 by using $HBF_4$. $HBF_4$ is tetrafluoroboric acid. $HBF_4$ also is called fluoroboric acid.

One, two, or more types selected from $HBF_4$, EDTA, NTA, CyDTA, DTPA, TTHA, GEDTA, glycine, dicarboxylic acid, tricarboxylic acid, oxycarboxylic acid, and salts of these substances may be combined.

EDTA, NTA, CyDTA, DTPA, TTHA, GEDTA, glycine, dicarboxylic acid, tricarboxylic acid, oxycarboxylic acid, and salts of these substances are called chelating agents. The chelating agent has an effect of suppressing the precipitation of Cu. The brazing material layer includes Cu. As the etching of the brazing material layer progresses, Cu ions in the etchant increase. Cu precipitates when the Cu ions exceed a constant amount. The etching rate decreases when the Cu that was once etched re-precipitates. Also, the pH of the etchant can be lowered by adding the chelating agent. It is favorable for the chelating agent to be one type selected from CyDTA, glycine, dicarboxylic acid, tricarboxylic acid, oxycarboxylic acid, and salts of these substances. These chelating agents are materials that easily form Cu ions and complex ions. Also, in the case where one type selected from CyDTA, glycine, dicarboxylic acid, tricarboxylic acid, oxycarboxylic acid, and salts of these substances is used as the chelating agent, it is favorable for the content in the etchant to be not less than 0.01 wt % and not more than 5 wt %. By such a content, the pH of the etchant can be adjusted to be within the range of 4.0 to 4.8.

Also, when the total of the masses of the hydrogen peroxide, the ammonium fluoride, and the pH-stabilizing agent is taken as 100 wt %, it is favorable for the content of hydrogen peroxide to be not less than 15 wt % and not more than 90 wt %. Also, it is favorable for the content of ammonium fluoride to be not less than 5 wt % and not more than 45 wt %. Also, it is favorable for the content of the pH-stabilizing agent to be not less than 5 wt % and not more than 50 wt %. Within these ranges, the roles of the components can be leveraged. Also, the oxidation-reduction potential (ORP) when etching the brazing material can be high. The rate at which the brazing material etching is performed can be faster thereby.

Also, it is favorable for the hydrogen peroxide, the ammonium fluoride, and the pH-stabilizing agent each to be mixed as aqueous solutions. A hydrogen peroxide-including aqueous solution that has a content of hydrogen peroxide of 15 to 70 wt % is favorable. An ammonium fluoride-including aqueous solution that has a content of ammonium fluoride of 15 to 60 wt % is favorable. A pH-stabilizing agent-including aqueous solution that has a content of the pH-stabilizing agent of 15 to 60 wt % is favorable.

Also, a brazing material etchant is adjusted by mixing the hydrogen peroxide-including aqueous solution, the ammonium fluoride-including aqueous solution, and the pH-stabilizing agent-including aqueous solution. The brazing material etchant may be diluted by mixing water. 0.5 to 2 L of water may be mixed when the total of the hydrogen peroxide-including aqueous solution, the ammonium fluoride-including aqueous solution, and the pH-stabilizing agent-including aqueous solution is 1 L (liter). Also, it is favorable for the mixing to be uniform by stirring sufficiently.

It is favorable for the water to satisfy the quality of JIS-K-0557 (1998). The quality of A1 to A4 is shown in WS-K-0557. ISO 3696 is referred to in WS-K-0557.

When the total of the masses of the ammonium peroxodisulfate, the ammonium fluoride, and the pH-stabilizing agent is taken as 100 wt %, it is favorable for the content of ammonium peroxodisulfate to be not less than 20 wt % and not more than 95 wt %, the content of ammonium fluoride to be not less than 3 wt % and not more than 55 wt %, and the content of the pH-stabilizing agent to be not less than 2 wt % and not more than 60 wt %. The roles of the components can be leveraged in these ranges. Also, the oxidation-reduction potential (ORP) when etching the brazing material can be high. The rate at which the brazing material etching is performed can be faster thereby.

Also, a brazing material etchant is adjusted by mixing the ammonium peroxodisulfate-including aqueous solution, the ammonium fluoride-including aqueous solution, and the pH-stabilizing agent-including aqueous solution. The brazing material etchant may be diluted by mixing water. 0.5 to 2 L of water may be mixed when the total of the ammonium peroxodisulfate-including aqueous solution, the ammonium fluoride-including aqueous solution, and the pH-stabilizing agent-including aqueous solution is 1 L (liter). Also, it is favorable for the mixing to be uniform by stirring sufficiently. It is favorable for the water to satisfy the quality of WS-K-0557 (1998). The quality of A1 to A4 is shown in JIS-K-0557.

The etching time can be shortened by etching the brazing material layer by using such a brazing material etchant. If the thickness of the brazing material layer is 60 μm or less, the etching can be performed in 30 minutes or less.

It is favorable for the brazing material etching process to be performed while applying an ultrasonic wave to the ceramic circuit board via the brazing material etchant. It is favorable for the frequency of the ultrasonic wave to be not less than 10 kHz and not more than 100 kHz.

By performing the brazing material etching process while applying the ultrasonic wave, the brazing material etching time can be shortened further. By performing the brazing material etching process while applying the ultrasonic wave, the time of one brazing material etching process can be 15 minutes or less. Although the lower limit of the time of the brazing material etching process is not particularly limited, it is favorable for the lower limit to be 1 minute or more. When less than 1 minute, the removal effect of the brazing material layer and the oxidation effect of the brazing material layer easily become insufficient. If these effects are small, there is a possibility that brazing material etching processes of a third time or more may be necessary. Increasing the number of brazing material etching processes may require a larger manufacturing apparatus of the ceramic circuit board.

The brazing material etchant and/or the etching conditions (the temperature, the time, the ultrasonic wave, etc.) may be changed when performing the brazing material etching process two or more times.

In the brazing material etching process, it is also effective to heat the brazing material etchant to not less than 30° C. and not more than 70° C. The etching reaction of the brazing material can be stimulated by heating.

The amount of the brazing material etchant is set to an amount in which the ceramic circuit board is completely immersed.

Figure 1:
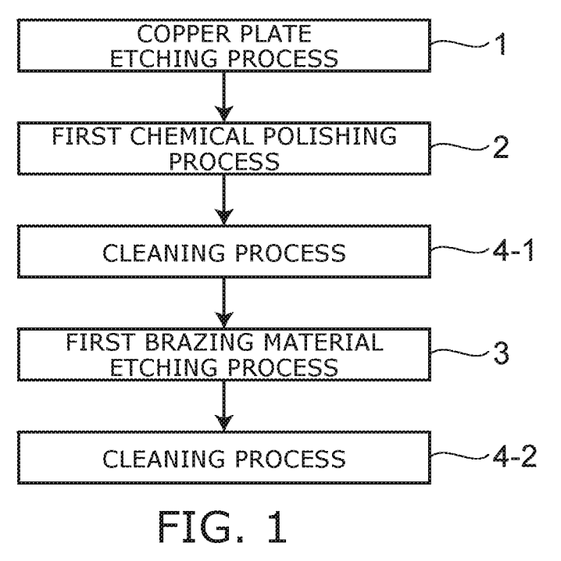
FIG. 1 is a view of a process illustrating a first embodiment.

FIG. 1 shows a view of a process illustrating a method for manufacturing a ceramic circuit board according to a first embodiment. The manufacturing method according to the first embodiment includes the copper plate etching process 1→first chemical polishing process 2→cleaning process 4-1→first brazing material etching process 3→cleaning process 4-2. A ceramic circuit board in which the brazing material layer is exposed is prepared by the copper plate etching process 1. Also, a cleaning process is performed as necessary. In the cleaning process, it is favorable to clean using purified water. In the cleaning process, it is sufficient for the immersion time in the purified water to be 10 seconds to 10 minutes.

Subsequently, the first chemical polishing process 2→cleaning process 4-1→first brazing material etching process 3→cleaning process 4-2 are performed. Cleaning processes are introduced respectively after the first chemical polishing process 2 and the first brazing material etching process 3. The etchant or the chemical polishing liquid can be prevented from remaining by performing the cleaning processes. Also, a drying process is performed as necessary after the cleaning process.

Figure 2:
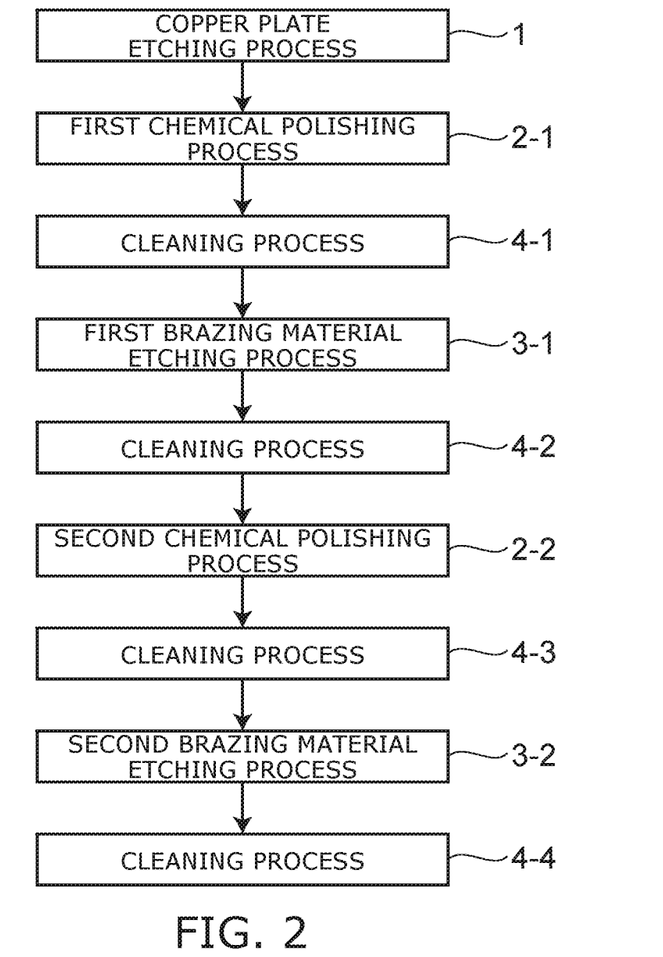
FIG. 2 is a view of a process illustrating a second embodiment.

A view of a process illustrating a method for manufacturing a ceramic copper circuit board according to a second embodiment is shown in FIG. 2. The method for manufacturing the ceramic copper circuit board according to the second embodiment includes the copper plate etching process 1→first chemical polishing process 2-1→cleaning process 4-1→first brazing material etching process 3-1→cleaning process 4-2→second chemical polishing process 2-2→cleaning process 4-3→second brazing material etching process 3-2→cleaning process 4-4. In the second embodiment, the second chemical polishing process 2-2 and the second brazing material etching process 3-2 are performed after the first chemical polishing process 2-1 and the first brazing material etching process 3-1. This method is effective when the brazing material layer cannot be removed sufficiently by the first chemical polishing process 2-1 and the first brazing material etching process 3-1. A component of the brazing material etchant used in the second brazing material etching process 3-2 may be different from a component of the brazing material etchant used in the first brazing material etching process 3-1.

Figure 3A:
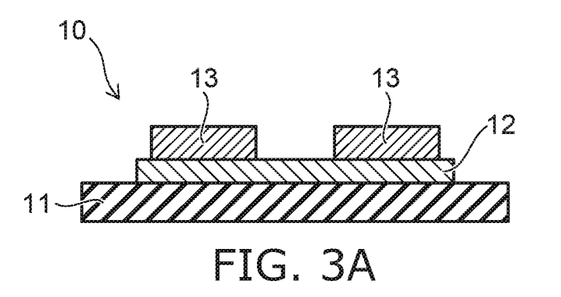
FIGS. 3A to 3C are drawings illustrating a ceramic circuit board corresponding to the process sequence.
Figure 3B:
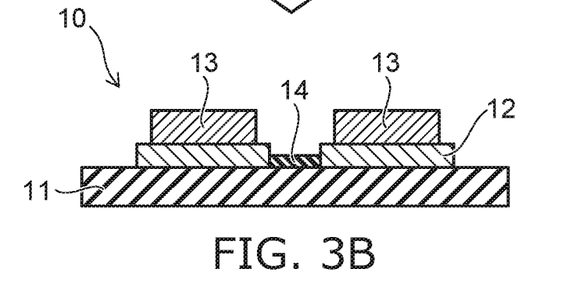
Figure 3C:
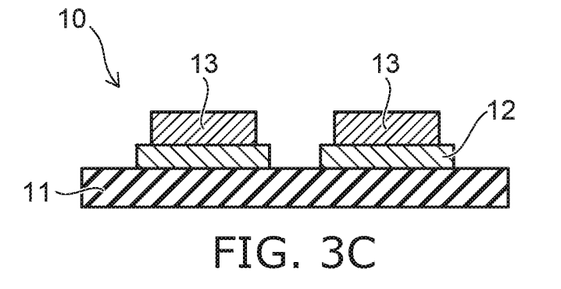

Process cross-sectional views of the ceramic circuit board are illustrated in FIG. 3A to FIG. 3C. In FIG. 3A to FIG. 3C, 10 is a ceramic circuit board; 11 is a ceramic substrate; 12 is a brazing material layer; 13 is a copper plate; and 14 is a brazing material oxide layer.

FIG. 3A illustrates the ceramic circuit board after the copper plate etching process. A portion of the brazing material layer between the copper plate pattern shape is exposed by etching the copper plate.

FIG. 3B is a state in which the portion of the brazing material layer that was exposed is removed by the first chemical polishing process and the first brazing material etching process. Also, a portion of the brazing material layer has become a brazing material oxide and remains.

FIG. 3C is after the second chemical polishing process. The brazing material oxide is removed by the second chemical polishing process.

Also, although not illustrated, the second brazing material etching process may be performed as illustrated in FIG. 2 if there is a possibility that the brazing material layer may remain after the first brazing material etching process. Also, a third chemical polishing process and a third brazing material etching process may be performed after the second brazing material etching process as necessary. Also, the brazing material etching process between the copper plate provided at one surface-side of the ceramic substrate is shown in FIGS. 3A to 3C. In the case where a copper plate is bonded via a brazing material layer also at the backside of the ceramic substrate, the brazing material etching process can be performed also for the back surface as necessary. Also, when the concentration of the brazing material etchant changes due to continuously manufacturing multiple ceramic copper circuit boards, the necessary amount is added. This is similar for the chemical polishing liquid as well.

An effective criterion of the concentration change of the brazing material etchant is to add the decrease amount of the hydrogen peroxide when the concentration of hydrogen peroxide has decreased 10 to 20 wt % from the initial concentration. This is similar also for the case where ammonium peroxodisulfate is used. Hydrogen peroxide or ammonium peroxodisulfate functions as an ionization or oxidizing agent of the reactive metal brazing material layer components. The etching process of the reactive metal brazing material layer is started by the function of the ionization or the oxidization being realized. The consumption proceeds from the hydrogen peroxide or the ammonium peroxodisulfate; therefore, it is favorable to confirm the concentration change of the hydrogen peroxide or the ammonium peroxodisulfate and use the concentration change as the criterion of the replenishment. Also, the pH of the brazing material etchant changes as the hydrogen peroxide or the ammonium peroxodisulfate decreases. A method of replenishing by measuring the pH of the brazing material etchant also is effective.

The consumed amount of the brazing material etchant changes according to the surface area of the reactive metal brazing material layer to be etched. In the case where multiple ceramic circuit boards are etched at one time, the total surface area of the reactive metal brazing material layer to be etched is used. A method of replenishing while confirming the component amounts and/or the pH of the brazing material etchant is favorable. A technique may be used in which the brazing material etching process progresses while replacing all of the brazing material etchant.

The copper plate etching process 1 is the patterning of the ceramic substrate before the brazing material etching-patterning. It is favorable for the ceramic circuit board before the patterning of the brazing material etching to be patterned into a pattern shape by etching-patterning after coating the etching resist on the copper plate. By coating the etching resist, the pattern shape and/or the distance between the pattern can be changed arbitrarily.

After etching-patterning the copper plate, it is favorable to perform brazing material etching-patterning of the ceramic circuit board from which the etching resist is removed. By removing the etching resist, discrepancies due to reactions of the etching resist with the brazing material etchant or the chemical polishing liquid can be prevented from occurring. When the etching resist reacts, there is a possibility that the pH of the brazing material etchant may exceed 6.

In the case where a combination of $HBF_4$ and a chelating agent is used as the pH-stabilizing agent, the pH of the brazing material etchant can be prevented from exceeding 6 even when the brazing material layer is etched while the etching resist remains.

According to the method for manufacturing the ceramic circuit board according to the embodiment, for example, the number of brazing material etching processes can be three or less. Also, because the time of one brazing material etching process also can be 30 minutes or less, the damage of the copper plate also is low. Therefore, the surface roughness Ra of the copper plate can be not less than 0.2 μm and not more than 1 μm even when the brazing material etching process is performed after removing the etching resist. By presetting the surface roughness Ra of the copper plate to 0.2 to 1 μm, the adhesion with the mold resin improves. A semiconductor device to which a semiconductor element is mounted is resin-molded with the ceramic circuit board. The copper plate surface is roughened to increase the adhesion strength with the resin. According to the method for manufacturing the ceramic circuit board according to the embodiment, the surface roughness of the copper plate surface can be controlled by performing the brazing material etching process. Therefore, it is unnecessary to perform a special process such as blasting, etc., to roughen the copper plate surface. From this perspective as well, the manufacturing efficiency increases. This is favorable particularly for the method for manufacturing a resin-molded ceramic circuit board.

According to a method for manufacturing a ceramic circuit board such as that described above, the time of one brazing material etching process can be shortened to 30 minutes or less, and even 15 minutes or less. Also, the distance between the pattern can be accommodated even when narrow, i.e., 2 mm or less, and even 1.5 mm or less. Also, the size of the brazing material jutting portion that remains can be not less than 10 μm and not more than 200 μm, and even not less than 10 μm and not more than 100 μm. That is, the time of the brazing material etching process can be shortened while controlling the distance between the pattern and the size of the brazing material jutting portion.

EXAMPLES

Examples 1 to 6, Examples 8 to 13, Reference Example and Comparative Examples 1 to 2

The silicon nitride substrate (having a substrate thickness of 0.32 mm, a thermal conductivity of 90 W/m·K, and a three-point bending strength of 650 MPa), an aluminum nitride substrate (having a substrate thickness of 0.635 mm, a thermal conductivity of 180 W/m·K, and a three-point bending strength of 350 MPa), an aluminum oxide substrate (having a substrate thickness of 0.635 mm, a thermal conductivity of 20 W/m·K, and a three-point bending strength of 450 MPa), and an Alusil substrate (having a substrate thickness of 0.635 mm, a thermal conductivity of 20 W/m·K, and a three-point bending strength of 500 MPa) were prepared as ceramic substrates. Also, the sizes of the ceramic substrates were unified to be length 140 mm×width 190 mm.

For the copper plates, the two types of a copper plate having a thickness of 0.5 mm and a copper plate having a thickness of 0.8 mm were prepared. The copper plate that had the thickness of 0.5 mm was taken as the "copper plate 1"; and the copper plate that had the thickness of 0.8 mm was taken as the "copper plate 2". Also, the sizes of the copper plates were unified to be length 130 mm×width 180 mm.

The bonding brazing materials shown in Table 1 were prepared.

TABLE 1

| | brazing material composition |
|---|---|
| brazing material 1 | Ag(55.5)—Cu(26)—Sn(10)—Ti(8)—C(0.5) |
| brazing material 2 | Ag(59)—Cu(25)—Sn(13)—Ti(3) |
| brazing material 3 | Ag(68)—Cu(30)—Ti(2) |

The reactive metal bonding process was performed by combining the ceramic substrate, the brazing material, and the copper plate as in Table 2. A brazing material layer that matched the copper plate size was coated; and the copper plate was placed.

The reactive metal bonding process was performed in a non-oxidative atmosphere at $1\times10^{-3}$ Pa or less. Also, the bonding was performed at 780 to 850° C. when using the brazing material 1 and the brazing material 2. Also, the bonding was performed at 860 to 880° C. when using the brazing material 3. Also, the copper plates were bonded to two surfaces of the ceramic substrate.

The ceramic circuit boards according to the samples 1 to 6 were prepared by these processes.

TABLE 2

| ceramic circuit board | ceramic substrate | brazing material | brazing material layer thickness (μm) | copper plate |
|---|---|---|---|---|
| sample 1 | silicon nitride substrate | brazing material 1 | 20 | copper plate 2 |
| sample 2 | silicon nitride substrate | brazing material 2 | 35 | copper plate 2 |
| sample 3 | silicon nitride substrate | brazing material 2 | 15 | copper plate 1 |
| sample 4 | silicon nitride substrate | brazing material 2 | 25 | copper plate 1 |
| sample 5 | aluminum nitride substrate | brazing material 2 | 20 | copper plate 1 |
| sample 6 | aluminum nitride substrate | brazing material 3 | 20 | copper plate 1 |
| sample 7 | Alusil substrate | brazing material 3 | 20 | copper plate 1 |

For the ceramic circuit boards according to the samples 1 to 6, after coating an etching resist on the copper plate on the front surface side, a pattern shape was patterned by etching-patterning. A location where the pattern-pattern distance was 1.5 mm and a location where the pattern-pattern distance was 2.0 mm were provided in the copper plate pattern. By performing copper plate etching-patterning, ceramic circuit boards in which the brazing material layers are exposed were prepared. The surface area of the exposed brazing material layer was unified to be 1000 $mm^2$ for one ceramic circuit board.

Then, the brazing material etchants shown in Table 3 and the chemical polishing liquids shown in Table 4 were prepared. For the brazing material etchants, the mass ratios are shown for when the total of the masses of hydrogen peroxide ($H_2O_2$), ammonium fluoride ($NH_4F$), and the pH-stabilizing agent is taken as 100 wt %. Aqueous solutions were mixed to provide the mass ratios shown in Table 3. Also, fluoroboric acid ($HBF_4$) was used as the pH-stabilizing agent. Also, the purified water amounts (L: liters) that were mixed with a total of 1 L of a hydrogen peroxide ($H_2O_2$)-including aqueous solution, an ammonium fluoride ($NH_4F$)-including aqueous solution, and a pH-stabilizing agent-including aqueous solution are shown. Also, the pH is shown for the brazing material etchants.

The chemical polishing liquids shown in Table 4 were used. Table 4 is the content (wt %) for the chemical polishing liquids. Also, the citric acid of Table 4 is one type of chelating agent and is tricarboxylic acid.

TABLE 3

| | brazing material etchant | | | | |
|---|---|---|---|---|---|
| | H2O2 (wt %) | NH4F (wt %) | HBF4 (wt %) | purified water(L) | pH |
| brazing material etchant 1 | 30 | 34 | 36 | 1.0 | 5.3 |
| brazing material etchant 2 | 25 | 40 | 35 | 0.8 | 5.6 |
| brazing material etchant 3 | 35 | 35 | 30 | 1.7 | 5.0 |
| brazing material etchant 4 | 65 | 20 | 15 | 1.2 | 4.9 |

TABLE 4

| | chemical polishing liquid (wt %) | |
|---|---|---|
| chemical polishing liquid 1 | H2O2 (9 wt %) + sulfuric acid (2 wt %) | purified water |
| chemical polishing liquid 2 | hydrochloric acid (5 wt %) | purified water |
| chemical polishing liquid 3 | Na2S2O3 (20 wt %) + citric acid (0.1 wt %) | purified water |

The methods for manufacturing the ceramic circuit boards according to the examples 1 to 6, the examples 8 to 10, and the reference example shown in Tables 5 and Table 6 were performed by combining the chemical polishing liquids 1 to 3, the brazing material etchants 1 to 4, and the ceramic circuit boards according to the samples 1 to 6. Also, a chemical polishing process was not performed for the comparative example 1. In each of the examples, the location where the brazing material layer was exposed between the pattern shape of the copper plate was removed. Also, a cleaning process using purified water was performed for 5 minutes after the brazing material etching process and after the chemical polishing process.

"xultrasonic wave" is displayed for the brazing material etching processes performed while applying an "ultrasonic wave". Also, the frequency of the ultrasonic wave was set to be within the range of 10 to 100 kHz. Also, the brazing material etching processes were performed while heating the brazing material etchant to 30 to 60° C.

TABLE 5

| | ceramic circuit board | chemical polishing process (first time) | brazing material etching process (first time) | chemical polishing process (second time) | brazing material etching process (second time) | chemical polishing process (third time) | brazing material etching process (third time) | chemical polishing process (fourth time) |
|---|---|---|---|---|---|---|---|---|
| example 1 | sample 1 | chemical polishing liquid 1 × 1 min. | brazing material etchant 1 × 5 min. × ultrasonic wave | chemical polishing liquid 1 × 1 min. | brazing material etchant 1 × 5 min. × ultrasonic wave | chemical polishing liquid 1 × 1 min. | brazing material etchant 1 × 5 min. × ultrasonic wave | chemical polishing liquid 1 × 1 min. |
| example 2 | sample 1 | chemical polishing liquid 1 × 1 min. | brazing material etchant 1 × 5 min. | chemical polishing liquid 1 × 1 min. | brazing material etchant 1 × 5 min. | — | — | — |
| example 3 | sample 2 | chemical polishing liquid 1 × 3 min. | brazing material etchant 1 × 10 min. × ultrasonic wave | chemical polishing liquid 1 × 3 min. | brazing material etchant 1 × 10 min. × ultrasonic wave | chemical polishing liquid 1 × 1 min. | — | — |
| example 4 | sample 3 | chemical polishing liquid 1 × 3 min. | brazing material etchant 1 × 13 min. × ultrasonic wave | chemical polishing liquid 1 × 1 min. | — | — | — | — |
| example 5 | sample 3 | chemical polishing liquid 2 × 2 min. | brazing material etchant 2 × 10 min. × ultrasonic wave | chemical polishing liquid 2 × 2 min. | brazing material etchant 2 × 10 min. × ultrasonic wave | chemical polishing liquid 2 × 1 min. | — | — |

TABLE 6

| | ceramic circuit board | chemical polishing process (first time) | brazing material etching process (first time) | chemical polishing process (second time) | brazing material etching process (second time) | chemical polishing process (third time) | brazing material etching process (third time) | chemical polishing process (fourth time) |
|---|---|---|---|---|---|---|---|---|
| example 6 | sample 4 | chemical polishing liquid 1 × 2 min. | brazing material etchant 1 × 8 min. × ultrasonic wave | chemical polishing liquid 1 × 2 min. | brazing material etchant 1 × 8 min. × ultrasonic wave | chemical polishing liquid 1 × 2 min. | brazing material etchant 1 × 8 min. × ultrasonic wave | chemical polishing liquid 2 × 1 min. |
| reference example | sample 5 | chemical polishing liquid 2 × 5 min. | brazing material etchant 3 × 10 min. × ultrasonic wave | — | — | — | — | — |
| example 8 | sample 6 | chemical polishing liquid 1 × 2 min. | brazing material etchant 2 × 7 min. × ultrasonic wave | chemical polishing liquid 1 × 2 min. | brazing material etchant 2 × 7 min. | — | — | — |
| example 9 | sample 1 | chemical polishing liquid 2 × 5 min. | brazing material etchant 4 × 13 min. × ultrasonic wave | chemical polishing liquid 2 × 1 min. | brazing material etchant 4 × 7 min. × ultrasonic wave | chemical polishing liquid 2 × 1 min. | brazing material etchant 4 × 7 min. × ultrasonic wave | chemical polishing liquid 2 × 1 min. |
| example 10 | sample 1 | chemical polishing liquid 3 × 5 min. | brazing material etchant 4 × 10 min. × ultrasonic wave | chemical polishing liquid 2 × 1 min. | brazing material etchant 4 × 5 min. × ultrasonic wave | chemical polishing liquid 2 × 1 min. | brazing material etchant 4 × 5 min. × ultrasonic wave | chemical polishing liquid 2 × 1 min. |
| comparative example 1 | sample 4 | — | brazing material etchant 1 × 10 min. × ultrasonic wave | — | — | — | — | — |
| comparative example 2 | sample 6 | — | brazing material etchant 1 × 120 min. × ultrasonic wave | — | — | — | — | — |

Also, the brazing material etchants shown in Table 7 were prepared.

For the brazing material etchants 5 to 9, the mass ratios are shown for when the total of the masses of the hydrogen peroxide ($H_2O_2$), the ammonium peroxodisulfate (($NH_4)_2S_2O_8$), the ammonium fluoride ($NH_4F$), and the pH-stabilizing agent is taken as 100 wt %. Aqueous solutions were mixed to provide the mass ratios shown in Table 7. Also, the citric acid of Table 7 is one type of chelating agent and is tricarboxylic acid.

TABLE 7

| | brazing material etchant | | | | | |
|---|---|---|---|---|---|---|
| | H2O2 or (NH4)2S2O8•(wt %) | NH4F (wt %) | HBF4 (wt %) | chelating agent (component•wt %) | purified water(L) | pH |
| brazing material etchant 5 | H2O2•35 | 30 | 33 | CyDTA•2 | 1.0 | 4.4 |
| brazing material etchant 6 | H2O2•40 | 33 | 26 | glycine•1 | 0.8 | 4.6 |
| brazing material etchant 7 | (NH4)2S2O8•45 | 25 | 27 | dicarboxylic acid•3 | 1.2 | 4.2 |

TABLE 7-continued

| | brazing material etchant | | | | | |
|---|---|---|---|---|---|---|
| | H2O2 or (NH4)2S2O8•(wt %) | NH4F (wt %) | HBF4 (wt %) | chelating agent (component•wt %) | purified water(L) | pH |
| brazing material etchant 8 | (NH4)2S2O8•50 | 28 | 21 | oxycarboxylic acid•1 | 1.2 | 4.7 |
| brazing material etchant 9 | (NH4)2S2O8•40 | 30 | 30 | — | 1.0 | 5.2 |
| brazing material etchant 10 | H2O2•65 | 20 | 15 | citric acid•0.2 | 1.0 | 4.5 |

Then, the brazing material etching processes shown in Table 8 were performed as the examples 11 to 16. The brazing material etching process was performed while causing the etching resist used in the copper plate etching process to remain. Otherwise, the conditions were such that the brazing material etching was performed by a method similar to that of the example 1.

The brazing material etching process was performed for thirty ceramic circuit boards at a time. The residual amount of the brazing material jutting portion was verified for the obtained ceramic circuit boards. The proportion of the region where the length of the brazing material jutting portion from the copper plate end portion between the pattern shape of the copper plate was within the range of 20

TABLE 8

| | ceramic circuit board | chemical polishing process (first time) | brazing material etching process (first time) | chemical polishing process (second time) | brazing material etching process (second time) | chemical polishing process (third time) |
|---|---|---|---|---|---|---|
| example 11 | sample 1 | chemical polishing liquid 1 × 1 min. | brazing material etchant 4 × 5 min. × ultra-sonic wave | chemical polishing liquid 1 × 1 min. | brazing material etchant 4 × 5 min. × ultra-sonic wave | chemical polishing liquid 1 × 1 min. |
| example 12 | sample 2 | chemical polishing liquid 1 × 1 min. | brazing material etchant 5 × 5 min. × ultra-sonic wave | chemical polishing liquid 1 × 1 min. | brazing material etchant 5 × 5 min. × ultra-sonic wave | chemical polishing liquid 1 × 1 min. |
| example 13 | sample 2 | chemical polishing liquid 1 × 1 min. | brazing material etchant 6 × 6 min. × ultra-sonic wave | chemical polishing liquid 1 × 2 min. | brazing material etchant 6 × 6 min. × ultra-sonic wave | chemical polishing liquid 1 × 2 min. |
| example 14 | sample 4 | chemical polishing liquid 2 × 1 min. | brazing material etchant 7 × 5 min. × ultra-sonic wave | chemical polishing liquid 2 × 1 min. | brazing material etchant 7 × 5 min. × ultra-sonic wave | chemical polishing liquid 2 × 1 min. |
| example 15 | sample 4 | chemical polishing liquid 2 × 2 min. | brazing material etchant 8 × 10 min. × ultra-sonic wave | chemical polishing liquid 2 × 2 min. | brazing material etchant 8 × 10 min. × ultra-sonic wave | chemical polishing liquid 2 × 2 min. |
| example 16 | sample 2 | chemical polishing liquid 3 × 1 min. → purified water cleaning → chemical polishing liquid 1 × 1 min. | brazing material etchant 4 × 4 min. × ultra-sonic wave | chemical polishing liquid 1 × 1 min. | brazing material etchant 4 × 4 min. × ultra-sonic wave | — | to 60 μm was determined. The length between the pattern shape of the copper plate was set to 100; and the length for which the size of the brazing material jutting portion was within the range of 20 to 60 μm was determined. Also, a measurement of the surface roughness Ra (μm) of the copper plate also was performed. The results are shown in Table 9.

TABLE 9

|  | proportion (%) of region where brazing material jutting portion amount was within range of 20 to 60 μm | surface roughness Ra of copper plate (μm) |
|---|---|---|
| example 1 | 100 | 0.8 |
| example 2 | 80 | 0.4 |
| example 3 | 100 | 0.7 |
| example 4 | 90 | 0.6 |
| example 5 | 100 | 0.9 |
| example 6 | 100 | 0.8 |
| reference example | 60 | 0.3 |
| example 8 | 80 | 0.5 |
| example 9 | 100 | 0.4 |
| example 10 | 100 | 0.3 |
| comparative example 1 | 0 | 0.4 |
| comparative example 2 | 0 | 1.6 |
| example 11 | 100 | 0.8 |
| example 12 | 100 | 0.8 |
| example 13 | 100 | 0.8 |
| example 14 | 100 | 0.8 |
| example 15 | 100 | 0.9 |
| example 16 | 100 | 0.5 |

It can be seen from the tables that in the examples of the favorable embodiments, etching was possible in which a brazing material jutting portion of 20 to 60 μm remained even when one brazing material etching process was 15 minutes or less. An ultrasonic wave was not applied in the example 2. Also, the brazing material etching process of the second time was not performed in the example 4. Also, the application of the ultrasonic wave and the brazing material etching process of the second time were not performed in the reference example. Also, an ultrasonic wave was not applied in the brazing material etching process of the second time in the example 8. Also, the length of the brazing material jutting portion was within the range of 20 to 100 μm in the example 2, the example 4, and the example 8. Also, the length of the brazing material jutting portion was within the range of 20 to 150 μm in the reference example.

Also, the chemical polishing was performed two times in the chemical polishing process of the first time in the example 16. The polishing effect was improved by using two types of chemical polishing liquids. Therefore, it was unnecessary to perform the chemical polishing process after the brazing material etching process of the second time.

Also, for the examples, the surface roughness Ra of the copper plate was within the range of 0.3 to 1.0 μm. The adhesion with the mold resin can be strengthened in this range. Also, this result shows that the copper plate substantially is not corroded.

In the comparative example 1, the brazing material layer could not be removed completely. Also, in the comparative example 2, the brazing material layer was removed too much; and the brazing material jutting portion was not formed.

From the results recited above, according to the embodiment, one brazing material etching process can be shortened to 15 minutes or less; and the state in which the necessary brazing material jutting portion remains can be formed. Therefore, it can be said that the manufacturing method is suited to manufacturing a ceramic circuit board having excellent TCT characteristics.

Although several embodiments of the invention are illustrated hereinabove, these embodiments are presented as examples and are not intended to limit the scope of the invention. These novel embodiments may be implemented in other various forms; and various omissions, substitutions, modifications, etc., can be performed without departing from the spirit of the invention. These embodiments and their modifications are within the scope and spirit of the invention and are within the scope of the invention described in the claims and their equivalents. Also, the embodiments described above can be performed in combination with each other.

What is claimed is:

1. A method for manufacturing a ceramic circuit board, the ceramic circuit board including a copper plate bonded to at least one surface of a ceramic substrate via a brazing material layer, the brazing material layer including Ag, Cu, and a reactive metal, the method for manufacturing the ceramic circuit board comprising:
   preparing a ceramic circuit board including a copper plate bonded on a ceramic substrate via a brazing material layer, a portion of the brazing material layer being exposed between a pattern shape of the copper plate, the brazing material layer including one type of two types selected from Sn and In;
   a first chemical polishing process of chemically polishing the portion of the brazing material layer;
   a first brazing material etching process of etching the chemically polished portion of the brazing material layer by using an etchant, the etchant having a pH of 6 or less and including one type or two types selected from hydrogen peroxide and ammonium peroxodisulfate; and
   a second chemical polishing process of chemically polishing the etched portion of the brazing material layer after the first brazing material etching process.

2. The method for manufacturing the ceramic circuit board according to claim 1, wherein the pH of the etchant is not less than 4.0 and not more than 5.8.

3. The method for manufacturing the ceramic circuit board according to claim 1, wherein the first brazing material etching process is performed while applying an ultrasonic wave.

4. The method for manufacturing the ceramic circuit board according to claim 1, wherein the first chemical polishing process is performed using a chemical polishing liquid including sulfuric acid or hydrochloric acid.

5. The method for manufacturing the ceramic circuit board according to claim 1, further comprising a second brazing material etching process of etching the etched portion of the brazing material layer by using an etchant after the second chemical polishing process, the etchant having a pH of 6 or less and including one type or two types selected from hydrogen peroxide and ammonium peroxodisulfate.

6. The method for manufacturing the ceramic circuit board according to claim 1, wherein a component of a chemical polishing liquid used in the second chemical polishing process is different from a component of a chemical polishing liquid used in the first chemical polishing process.

7. The method for manufacturing the ceramic circuit board according to claim 1, further comprising a cleaning process of cleaning the ceramic circuit board after the first brazing material etching process and the first chemical polishing process.

8. The method for manufacturing the ceramic circuit board according to claim 1, wherein
a thickness of the brazing material layer is 60 μm or less, and
the first brazing material etching process is performed in 30 minutes or less.

9. The method for manufacturing the ceramic circuit board according to claim 1, wherein
the first chemical polishing process is performed using a chemical polishing liquid, and
the chemical polishing liquid is sulfuric acid aqueous solution of which a sulfuric acid concentration is within the range of 0.5 to 25 wt %, or hydrochloric acid aqueous solution of which a hydrochloric acid concentration is within the range of 0.5 to 20 wt %.

10. The method for manufacturing the ceramic circuit board according to claim 1, wherein
the etched portion of the brazing material layer includes a compound of at least one selected from Ag, Cu, and the reactive metal, and
the compound is formed in the first brazing material etching process and removed in the second chemical polishing process.

11. The method for manufacturing the ceramic circuit board according to claim 1, wherein the etchant includes ammonium fluoride, a pH-stabilizing agent, and one type or two types selected from hydrogen peroxide and ammonium peroxodisulfate.

12. The method for manufacturing the ceramic circuit board according to claim 11, wherein the pH-stabilizing agent is one, two, or more types selected from $HBF_4$, EDTA, NTA, CyDTA, DTPA, TTHA, GEDTA, glycine, dicarboxylic acid, tricarboxylic acid, oxycarboxylic acid, and salts of $HBF_4$, EDTA, NTA, CyDTA, DTPA, TTHA, GEDTA, glycine, dicarboxylic acid, tricarboxylic acid, and oxycarboxylic acid.

13. The method for manufacturing the ceramic circuit board according to claim 1, wherein the ceramic substrate is a nitride ceramic substrate.

14. The method for manufacturing the ceramic circuit board according to claim 13, further comprising a second chemical polishing process of chemically polishing the etched portion of the brazing material layer after the first brazing material etching process.

15. The method for manufacturing the ceramic circuit board according to claim 1, wherein the ceramic circuit board before performing the first brazing material etching process is patterned into the pattern shape by etching-patterning the copper plate after coating an etching resist on the copper plate.

16. The method for manufacturing the ceramic circuit board according to claim 15, wherein the first brazing material etching process is performed on the ceramic circuit board having the etching resist removed after the etching-patterning of the copper plate.

17. The method for manufacturing the ceramic circuit board according to claim 1, wherein
the pH of the etchant is not less than 4.0 and not more than 5.8, and
the etchant includes ammonium fluoride, a pH-stabilizing agent, and one type or two types selected from hydrogen peroxide and ammonium peroxodisulfate.

18. The method for manufacturing the ceramic circuit board according to claim 17, wherein the pH-stabilizing agent is one, two, or more types selected from $HBF_4$, EDTA, NTA, CyDTA, DTPA, TTHA, GEDTA, glycine, dicarboxylic acid, tricarboxylic acid, oxycarboxylic acid, and salts of $HBF_4$, EDTA, NTA, CyDTA, DTPA, TTHA, GEDTA, glycine, dicarboxylic acid, tricarboxylic acid, and oxycarboxylic acid.

19. The method for manufacturing the ceramic circuit board according to claim 15, wherein the first chemical polishing process is performed using a chemical polishing liquid including sulfuric acid or hydrochloric acid.

20. A method for manufacturing a ceramic circuit board, the ceramic circuit board including a copper plate bonded to at least one surface of a ceramic substrate via a brazing material layer, the brazing material layer including Ag, Cu, and a reactive metal, the method for manufacturing the ceramic circuit board comprising:
preparing a ceramic circuit board including a copper plate bonded on a ceramic substrate via a brazing material layer, a portion of the brazing material layer being exposed between a pattern shape of the copper plate, wherein a thickness of the brazing material layer being 60 μm or less;
a first chemical polishing process of chemically polishing the portion of the brazing material layer;
a first brazing material etching process of etching the chemically polished portion of the brazing material layer by using an etchant, the etchant having a pH of 6 or less and including one type or two types selected from hydrogen peroxide and ammonium peroxodisulfate, wherein the first brazing material etching process is performed in 30 minutes or less; and
a second chemical polishing process of chemically polishing the etched portion of the brazing material layer after the first brazing material etching process.

* * * * *